(12) United States Patent
Ayres, III et al.

(10) Patent No.: US 7,915,544 B1
(45) Date of Patent: Mar. 29, 2011

(54) CABLE SEAL APPARATUS AND TECHNIQUES FOR OUTSIDE PLANT TELECOMMUNICATIONS HOUSINGS

(75) Inventors: John W. Ayres, III, Cumming, GA (US); Grant J. Kruse, Owens Cross Roads, AL (US); Jacob D. McCleary, Harvest, AL (US)

(73) Assignee: Adtran, Inc., Huntsville, AL (US)

( * ) Notice: Subject to any disclaimer, the term of this patent is extended or adjusted under 35 U.S.C. 154(b) by 206 days.

(21) Appl. No.: 12/133,403

(22) Filed: Jun. 5, 2008

(51) Int. Cl.
*H01L 23/02* (2006.01)
*H05K 5/06* (2006.01)

(52) U.S. Cl. ..................... 174/564; 174/77 R

(58) Field of Classification Search .............. 174/38, 174/77 R, 520, 564; 361/752
See application file for complete search history.

(56) References Cited

U.S. PATENT DOCUMENTS

| 5,072,073 | A | * | 12/1991 | Becker et al. ............... 174/76 |
| 5,117,067 | A | | 5/1992 | Jaycox ............... 174/38 |
| 5,323,454 | A | | 6/1994 | Shay et al. ............... 379/327 |
| 5,734,776 | A | | 3/1998 | Puetz ............... 385/134 |
| 5,781,410 | A | | 7/1998 | Keown et al. ............... 361/690 |
| 5,886,296 | A | | 3/1999 | Ghorgani et al. ............... 174/50 |
| 6,535,603 | B2 | | 3/2003 | Laetsch ............... 379/338 |
| 6,760,531 | B1 | | 7/2004 | Solheid et al. ............... 385/135 |
| 6,798,878 | B2 | | 9/2004 | Laetsch ............... 379/338 |
| 7,075,789 | B2 | | 7/2006 | Gustine et al. ............... 361/703 |
| 7,132,605 | B2 | | 11/2006 | Holmberg et al. ............... 174/135 |
| 7,190,874 | B1 | | 3/2007 | Barth et al. ............... 385/135 |
| 7,232,955 | B1 | * | 6/2007 | Shadel et al. ............... 174/74 R |
| 7,278,882 | B1 | * | 10/2007 | Li ............... 439/578 |
| 2002/0027008 | A1 | * | 3/2002 | Berg et al. ............... 174/24 |
| 2003/0078015 | A1 | | 4/2003 | Laetsch ............... 455/90 |
| 2006/0193590 | A1 | | 8/2006 | Puetz et al. ............... 385/135 |
| 2007/0047894 | A1 | | 3/2007 | Holmberg et al. ............... 385/135 |

* cited by examiner

*Primary Examiner* — Hung V Ngo
(74) *Attorney, Agent, or Firm* — Allen, Dyer, Doppelt, Milbrath & Gilchrist, P.A.

(57) ABSTRACT

Signals entering outside plant (OSP) telecommunications enclosures typically do so through weather tight connectors, with one connector mounted to the enclosure and a mating connector connected to a cable bringing the signals to the OSP housing. Such connectors are expensive and require extensive effort to connect the wires of a cable bundle to the connectors. These problems are avoided by allowing cables pre-installed with a cable seal and pre-terminated to cable connectors to pass through an opening in the wall of an OSP housing and seal the cable bundle to the housing to prevent the ingress of environmental elements into the housing through the opening. This permits easier installation and retrofitting of electronic equipment contained within the housing.

11 Claims, 4 Drawing Sheets

CABLE SEAL APPARATUS AND TECHNIQUES FOR OUTSIDE PLANT TELECOMMUNICATIONS HOUSINGS

FIELD OF THE INVENTION

The invention is directed to the field of electrical connection and more particularly to cable seal apparatus and techniques for outside plant telecommunications housings.

DESCRIPTION OF THE PRIOR ART

Telecommunications networks often include cables that extend from central installations through one or more cabinets or enclosures to reach the customer. Within these enclosures, a variety of equipment may be mounted to provide the signal processing, splitting or accumulation, and also may provide cross-connections between different cables. The enclosures provide security from accidental or intentional damage to the equipment mounted within and also provide weather protection from environmental damage. Cable entering the enclosure may pass through a cable seal which ensures a weather-tight seal between the cable and the housing.

Such enclosures are commonly referred to as outside plant (OSP) housings.

Once an OSP housing has been assembled with equipment and has had cable lead into the interior and connected to the equipment, it may be desirable to change the housing to replace the damaged elements. Such damage might be caused by an automobile accidentally impacting the enclosure or a construction accident.

For changes made to the housing for any reason, known housings and cable seals require that an end of the cable pass through the cable seal. This necessitates cutting and re-terminating many of the cables or wire pairs contained within a cable bundle that extend into the housing. It is often desirable to use pre-terminated cables to speed installation and reduce the amount of fieldwork required.

U.S. Pat. No. 7,132,605 to Homberg et al. discloses a cable seal which is split in such a way as to allow it to be assembled around a cable that is passing into such a housing.

PROBLEMS OF THE PRIOR ART

A typical OSP housing utilizes weather resistant connector pairs to allow signals from outside the housing to pass into the housing. Such connectors can be expensive, often costing as much as $150 each. Thus, the use of connectors is less desirable from a cost perspective. In addition, substantial labor costs are involved in connecting the wires of an inside cable to the pins of the connector at one end and to connect the wires from the connector to a different connector designed to interface with a connector on, for example, a printed circuit board. Further, wires bringing signals to the OSP housing must be terminated in a mating connector so that the signals can pass through the wall of the OSP housing, using a mating connector.

Further, when the contents of the OSP housing need to be reworked, such as to facilitate a change of cables or to facilitate an upgrade to an existing printed circuit board, if a change in connector type must be made, then the entire wiring process needs to be repeated for the new type of connector.

Thus, it is highly desirable to have an improved way of connecting outside plant telecommunications equipment to cables providing signals to and from the OSP housing.

SUMMARY OF THE INVENTION

Accordingly, Applicants have provided improved cable seal apparatus and techniques for interconnecting outside plant telecommunication housings to cables providing signals to and from those housings.

One aspect of the invention is directed to an outside plant (OSP) telecommunications housing, which has an opening for allowing a bundle of communications conductors pre-terminated with one or more end connectors to pass through a wall of the housing. A cable seal attaches to said opening to seal said bundle of communications cables to said housing to prevent the ingress of environmental elements into the housing.

Another aspect of the invention is directed to a telecommunications system which has a central office for distributing communication signals to subscribers and electronic equipment located between said central office and said subscribers and contained in an outside plant telecommunications housing. The outside plant telecommunications housing has an opening for allowing a bundle of communications conductors pre-terminated with one or more end connectors to pass through a wall of the housing and connect to said electronic equipment. The cable is also pre-installed with a cable seal to attach to said housing to prevent the ingress of environmental elements into the housing through said opening. The connectors may be a customer connector and/or a network connector.

Another aspect of the invention relates to a method of installing electronic equipment in an outside plant telecommunications housing, by positioning and securing said electronic equipment in said housing, passing a bundle of communications conductors pre-installed with a cable seal and pre-terminated with one or more end connectors through an opening in a wall of said housing, and by securing said seal to said housing and to said bundle to prevent the ingress of environmental elements into the housing through said opening.

Another aspect of the invention relates to a method of retrofitting an outside plant telecommunications housing with different electronic equipment by disconnecting at least one connector from at least one piece of electronic equipment, removing that piece of electronic equipment and replacing it with a different piece of electronic equipment, and removing a cable bundle containing communication conductors terminated in said at least one connector by removing a cable seal securing said bundle to said housing and passing the connector through said housing to remove the cable bundle. A new cable bundle pre-installed with a cable seal and pre-terminated with one or more end connectors is then passed through an opening in a wall of said housing and the cable seal secures the said bundle to the housing to prevent the ingress of environmental elements into the housing through said opening. Then at least one pre-terminated end connector is connected to at least one mating connector on at least one different piece of electronic equipment.

DETAILED DESCRIPTION OF THE PREFERRED EMBODIMENTS

Figure 1:
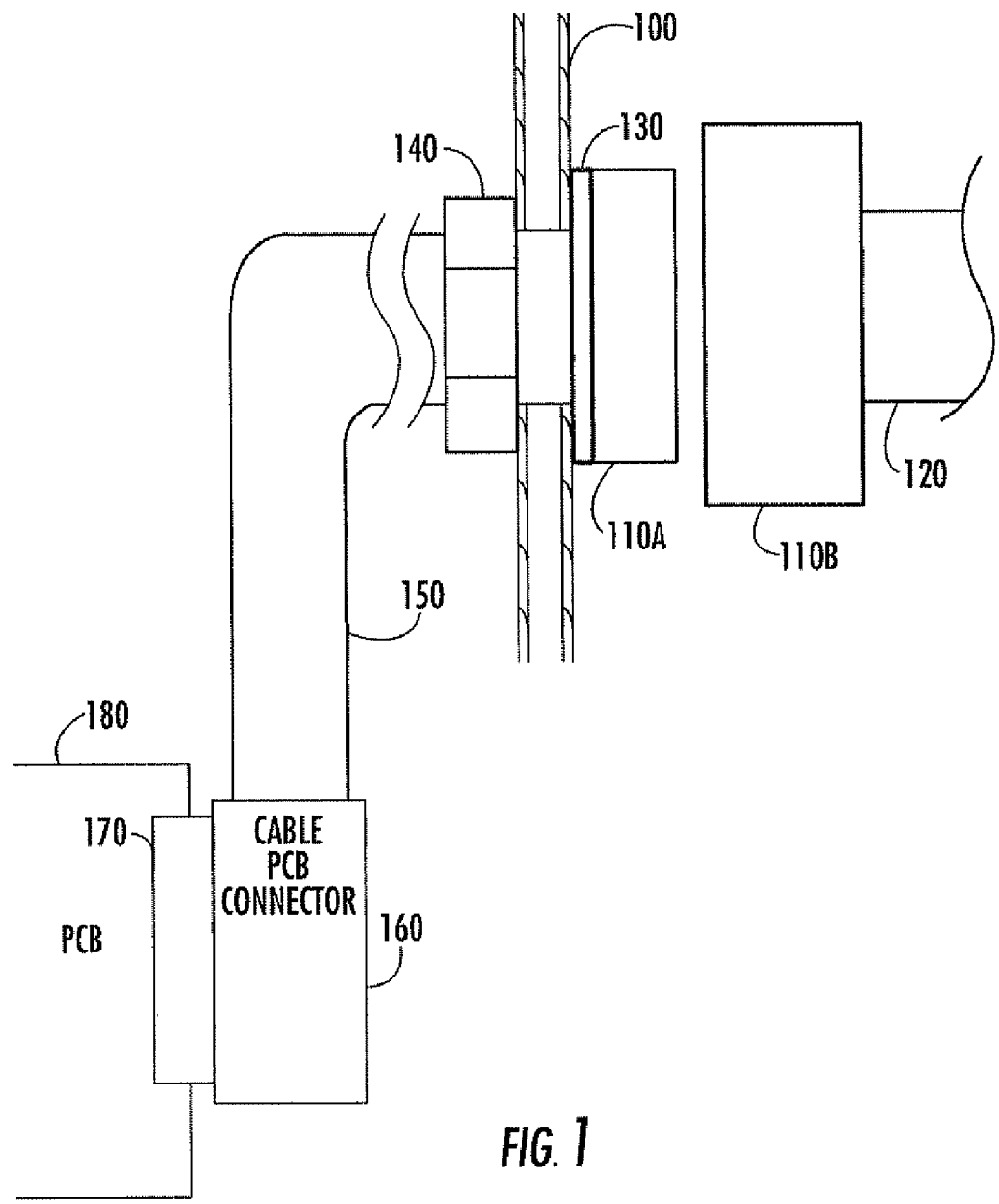
FIG. 1 is a partially cut away view of an outside plant enclosure showing the use of mating connectors as used in the prior art.

FIG. 1 is a partially cut away view of an outside plant enclosure showing the use of mating connectors as used in the prior art. FIG. 1 shows a housing wall 100 that provides an opening upon which a connector body 110A is mounted and secured to the housing wall using connector nut 140. Optionally, seal 130 is provided between the external portions of the connector 110A and the housing wall to ensure a watertight or water-resistant seal. The connector 110A has a number of contact pins or receptacles which match a corresponding plurality of pins or receptacles in connector 110B. Each of the pins or receptacles in connector 110A and 110B are individually connected to wires of either wire bundle 120 or internal wire bundle 150. The connection of wires from a wire bundle to the contact pins or receptacles of connectors can be a time consuming and laborious undertaking.

Connectors 110A and 110E are mating connectors designed so that the male pin matches a corresponding receptacle pin in the body of the connectors. It does not matter whether connector 110A or connector 110B is the male connector. The other connector will be a female connector. Which connector is the male connector will depend upon normal electrical design considerations such as whether or not exposure to high voltage on a pin constitutes a threat of injury to operator personnel or to equipment, should contact with operator personnel or a conductive path on the equipment encounter a relatively high voltage pin. Inside the housing, that is to the left of the housing wall 100 as shown, a wire bundle 150, generally containing a plurality of wires from the connector 110A, runs to a cable mounted PCB connector 160. PCB connector 160 is designed to interface with a board mounted PCB connector 170 of corresponding and mating design which is, in common arrangements, affixed to printed circuit board 180.

As mentioned above, such through the wall sealed connectors 110A are very expensive. Further, the wiring costs associated with connecting the wires from the connector 110A to the internal wire bundle 150 and then to the PCB 160 constitute a considerable effort.

If, in the course of upgrading the electronics inside the OSP housing, it becomes desirable to replace a PCB 180 with an upgraded and improved version, and if that upgraded and improved version requires a different connector, the cable mounted PCB connector 160 will need to be replaced. That will require disconnecting the wiring to the through the wall connector 110A so that new wiring can be provided. Similarly, if new wiring is required, the wire bundle 120 might need to be arranged to accommodate changes to the pin assignments of connector 110B that correspond to the changed pin assignments for connector 110A. Thus, in addition to the substantial connector costs for such an arrangement, considerable wiring costs are associated with the installation and potential rework of equipment within the OSP housing.

Figure 2:
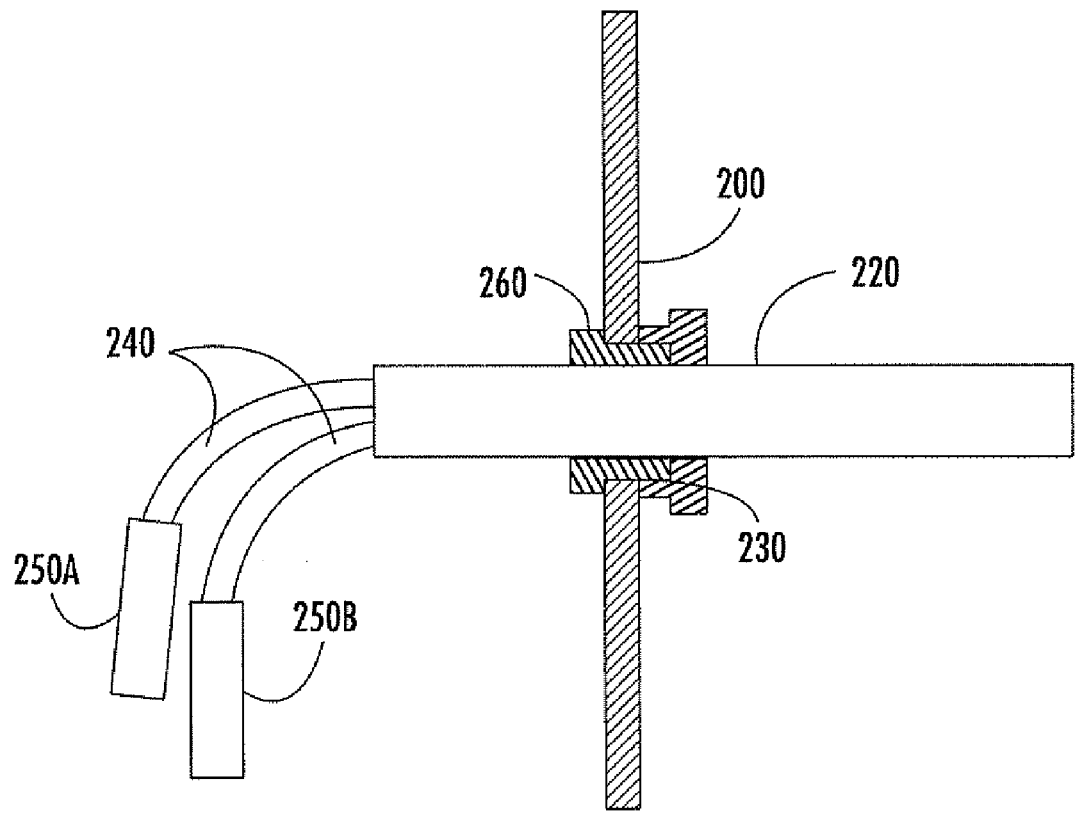
FIG. 2 is a partially cut away view of an outside plant enclosure showing an improvement in cable interconnections in accordance with one aspect of the invention.

FIG. 2 is a partially cut away view of an outside plant enclosure showing an improvement in cable interconnections in accordance with one aspect of the invention. As shown in FIG. 2, a cable 220 with a plurality of wires encased, passes through a connector hole 230 through the housing wall 200. The cable 220 is provided, in the example shown, with two wire pair bundles 240, each respectively terminated to a connector 250A and 250B. Typically, connectors 250A and 250B can be cable mounted PC connectors of the type shown in item 160 of FIG. 1. The cable 220 is surrounded by a liquid tight strain relief fitting 260 which is preferably of a size known as a PG 29 manufactured or provided by Sealcon, Inc. of Centennial Colo. The size of the connector hole 230 depends upon the particular cable size and the cable fitting selected, and is sufficiently sized to allow connectors 250A and 250B to pass through. The cable fitting 260 is selected so that the cable seal 260 can provide a snug and liquid-tight interface to the cable 220.

Figure 3:
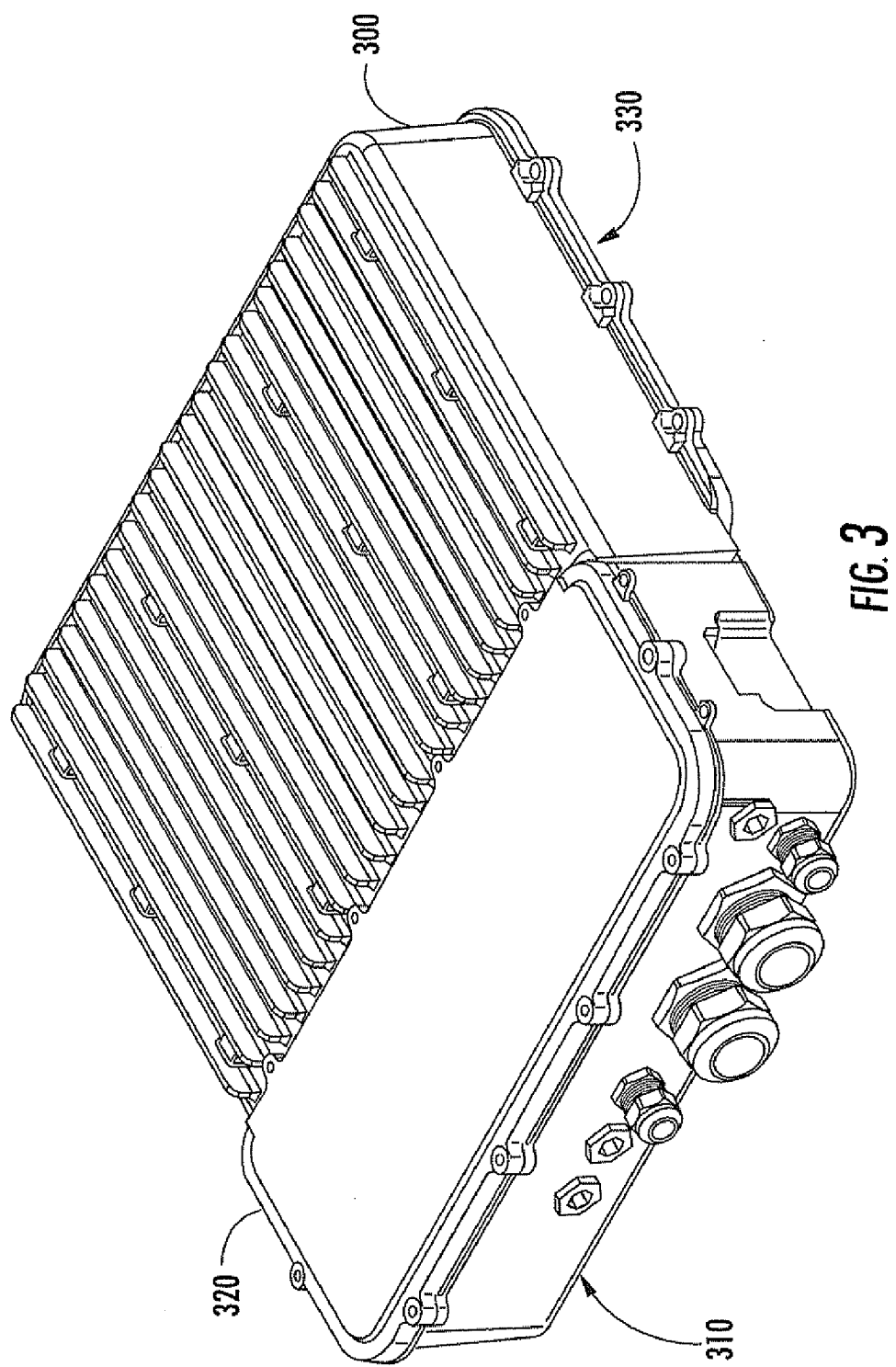
FIG. 3 shows an example of an outside plant enclosure assembled for installation.

FIG. 3 shows a modular outside plant enclosure assembled for installation. In the arrangement shown in FIG. 3 the main casting 300 is already secured to the smaller casting 310. Each of the main casting and the smaller casting has a removable lid, 320 for the smaller casting and 330 for the main casting respectively.

Figure 4:
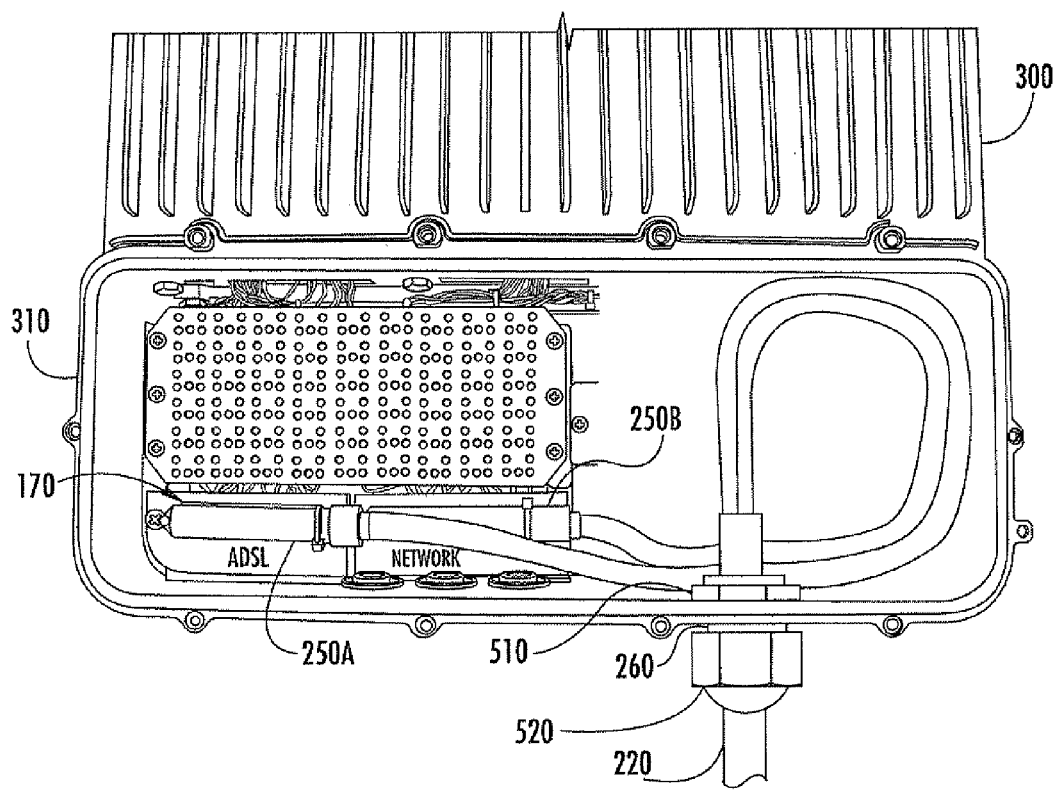
FIG. 4 shows an assembled outside plant housing with the top of the smaller piece removed to show simplified sample electronics contained therein in accordance with one aspect of the invention.

FIG. 4 shows a portion of the housing of FIG. 3 outside plant housing with lid 320 removed to show simplified sample electronics cable and connectors contained therein in accordance with one aspect of the invention. In this depiction, two cable attached connectors 250A and 250E are mounted to corresponding connectors 170 mounted to a panel mounted to the smaller housing 310. As one can see, the smaller housing is bolted to the larger housing in this view. As shown, the cable with the wire bundles for each of the customer and network connectors shown in FIG. 4 passes through cable seal 260 and through the wall of the housing into the inside of the smaller housing 310.

As discussed above, the minimum diameter for the connector hole 230 and liquid tight strain relief cable fitting is such as to permit the connectors 250A and 250B to pass through the wall of housing 310 even when one wire bundle may already be inserted through the opening. The cable seal body is then connected to the housing and the dome-nut 520, which forms part of the cable strain relief assembly, secures the cable seal connector to the cable in a liquid-tight arrangement as it is screwed down onto the body of the cable seal. Inside the smaller housing 310, there is a locking nut 510 which secures the body of the cable seal to the housing optionally using an O-ring or a seal-ring to prevent the ingress of liquid into the housing. Alternatively, threads may be created in housing 310 to replace the locking nut 510.

Replacement of the installed electronic assembly with an upgrade or replacement can be accomplished without cutting or splicing cables. To replace an existing installed electronic assembly in the housing 300 and 310, the cable attached connectors 250A and 250B can be disconnected, the cables can be removed from the housing 310 through the connector hole 230 and be replaced by a different product with connectors having compatible pin assignments for the upgraded version of the product.

In this manner, many of the problems associated with the prior art installation and reworking of electronic equipment within OSP (Outside Plant Product) housings can be eliminated. The cost associated with through the wall watertight connectors of the type known in the prior art can be avoided and the through the wall connectors can be replaced with a much less expensive cable seal as described.

While various embodiments of the present invention have been illustrated herein in detail, it should be apparent that modifications and adaptations to those embodiments may occur to those skilled in the art without departing from the scope of the present invention as set forth in the following claims.

Many modifications and other embodiments of the invention will come to the mind of one skilled in the art having the benefit of the teachings presented in the foregoing descriptions and the associated drawings. Therefore, it is understood that the invention is not to be limited to the specific embodi- That which is claimed is:

1. An outside plant telecommunications housing and having a rectangular configured housing wall and forming an enclosure, a single printed circuit board supported within a first portion of the enclosure and a second remaining portion forming a cable storage area to store accumulated cable, and further comprising an opening at the cable storage area for allowing a bundle of communications conductors pre-terminated with one or more end connectors to pass through a wall of the housing and secured onto said printed circuit board, and a cable seal for attaching to said opening to seal said bundle of communications cables to said housing to prevent the ingress of environmental elements into the housing through said opening, and further comprising a locking nut that secures the cable seal to the housing at the opening and an O-ring secured by the locking nut to seal the bundle of communications connectors at the housing in a watertight manner, and further comprising a dome-nut configured to aid in securing the cable seal to the housing.

2. The outside plant telecommunications housing according to claim 1, wherein said housing includes a lid that is configured to be removed to access the interior of the housing.

3. The outside plant telecommunications housing according to claim 1, wherein said housing comprises a first housing section that receives the bundle of communications conductors, and further comprising a second, main housing section secured to said first housing.

4. The outside plant telecommunications housing according to claim 3, wherein said first housing section and second, main housing section are substantially rectangular configured.

5. The outside plant telecommunications housing according to claim 3, wherein said first housing section is bolted to said second, main housing section.

6. A telecommunications system comprising:
   a central office for distributing communication signals to subscribers;
   electronic equipment located between said central office and said subscribers and contained in an outside plant telecommunications housing, in which the outside plant telecommunications housing comprises a rectangular configured housing wall and forming an enclosure, a single printed circuit board supported within a first portion of the enclosure and supporting the electronic equipment and a second remaining portion forming a cable storage area to store accumulated cable and an opening at the cable storage area for allowing a bundle of communications conductors pre-terminated with one or more end connectors to pass through a wall of the housing at the opening and connect to said electronic equipment, and a cable seal for attaching to said opening to seal said bundle of communications cables to said housing to prevent the ingress of environmental elements into the housing through said opening, and further comprising a locking nut that secures the cable seal to the housing at the opening and an O-ring secured by the locking nut to seal the bundle of communications connectors at the housing in a watertight manner, and further comprising a dome-nut configured to aid in securing the cable seal to the housing.

7. The telecommunications system of claim 6, in which the one or more end connectors comprise at least one of a customer connector and a network connector.

8. The telecommunications system according to claim 6, wherein said housing includes a lid that is configured to be removed to access the interior of the housing.

9. The telecommunications system according to claim 6, wherein said housing comprises a first housing section that receives the bundle of communications conductors, and further comprising a second, main housing section secured to said first housing.

10. The telecommunications system according to claim 9, wherein said first housing section and second, main housing section are substantially rectangular configured.

11. The telecommunications system according to claim 9, wherein said first housing section is bolted to said second, main housing section.

\* \* \* \* \*